(12) United States Patent
Chen et al.

(10) Patent No.: US 9,717,333 B2
(45) Date of Patent: Aug. 1, 2017

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen You, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/982,233

(22) Filed: Dec. 29, 2015

(65) Prior Publication Data

US 2016/0324317 A1 Nov. 10, 2016

(30) Foreign Application Priority Data

May 5, 2015 (TW) .............................. 104114359 A (51) Int. Cl.
*A47B 88/00* (2017.01)
*A47B 88/04* (2006.01)
*H05K 7/14* (2006.01)
*A47B 88/43* (2017.01)

(52) U.S. Cl.
CPC ............ *A47B 88/044* (2013.01); *A47B 88/43* (2017.01); *H05K 7/1489* (2013.01)

(58) Field of Classification Search
CPC .............................. A47B 88/044; H05K 7/1489
USPC ........................ 248/218.4; 312/334.4, 334.5
See application file for complete search history.

(56) References Cited

U.S. PATENT DOCUMENTS

| | | | |
|---|---|---|---|
| 6,181,549 B1 | 1/2001 | Mills et al. | |
| 6,398,041 B1* | 6/2002 | Abbott | H02B 1/36 211/26 |
| 6,883,884 B2 | 4/2005 | Chen et al. | |
| 7,144,184 B1* | 12/2006 | Tsai | A47B 88/044 211/192 |
| 8,371,454 B2* | 2/2013 | Chen | A47B 88/044 211/26 |
| 8,403,432 B2* | 3/2013 | Chen | A47B 88/044 312/333 |
| 9,313,914 B2* | 4/2016 | Judge | H05K 7/1489 |
| 9,370,120 B2* | 6/2016 | Chen | A47B 96/025 |
| 2002/0074914 A1* | 6/2002 | Shih | A47B 88/044 312/334.4 |
| 2008/0296455 A1* | 12/2008 | Brock | A47B 88/044 248/298.1 |

* cited by examiner

*Primary Examiner* — Anita M King
(74) *Attorney, Agent, or Firm* — Rosenberg, Klein & Lee (57) ABSTRACT

A bracket device is adapted for mounting an object arranged on a slide rail assembly to a post of a rack. The bracket device includes a bracket and an engagement member. The bracket is connected to the slide rail assembly and has a longitudinal wall and an end wall substantially perpendicularly connected to the longitudinal wall. The end wall is mounted to the post of the rack by at least one mounting member. The engagement member is arranged on the bracket and releasably engaged with a portion of the object.

9 Claims, 9 Drawing Sheets

BRACKET DEVICE

FIELD OF THE INVENTION

The present invention relates to a bracket device and more particularly to a bracket device adapted for mounting an object arranged on a slide rail assembly to a post of a rack so that the object can be selectively retained in place.

BACKGROUND OF THE INVENTION

In a rack-based system as disclosed in U.S. Pat. No. 6,181,549 B1, a plurality of chassis (105, 110, 115) can be mounted to a rack (101) via plural pairs of slide rail assemblies respectively. Each slide rail assembly includes a rack rail (120) and a chassis rail (122), wherein the rack rail (120) is attached to the rack while the chassis rail (122) is attached to the chassis (105, 110, 115). In an embodiment of the invention for which the aforesaid patent is granted, the chassis is provided with a handle (301) and a securing device (307) which extends through a perforation (133) of a vertical member (130) of the rack, and which has a retaining surface (309) retained by the backside of the vertical member (130) of the rack in order to secure the chassis to the rack (101). In addition, the handle (301) has a trigger release (322) for disengaging the securing device (307) from the vertical member (130) of the rack. The disclosure of the foregoing invention is incorporated herein by reference.

SUMMARY OF THE INVENTION

The present invention relates to a bracket device for selectively retaining an object in place.

According to one aspect of the present invention, a bracket device is adapted for mounting an object arranged on a slide rail assembly to a post of a rack and includes a bracket and an engagement member. The bracket is connected to the slide rail assembly and includes a longitudinal wall and an end wall. The end wall is substantially perpendicularly connected to the longitudinal wall and is mounted to the post of the rack via at least one mounting member. The engagement member is arranged on the bracket and is releasably engaged with a portion of the object.

According to another aspect of the present invention, a bracket device is adapted for mounting a slide rail assembly to a post of a rack, wherein the slide rail assembly includes a first rail and a second rail longitudinally displaceable relative to the first rail, and wherein an object is arranged on the second rail. The bracket device includes a bracket and an engagement member. The bracket is connected to the first rail of the slide rail assembly and includes a longitudinal wall and an end wall. The end wall is substantially perpendicularly connected to the longitudinal wall and is mounted to the post of the rack via at least one mounting member. The engagement member is operatively arranged on the bracket. When the second rail is at a position relative to the first rail, the engagement member can engage with a portion of the object. Once the engagement member is operated and thus disengaged from the portion of the object, the second rail can be moved from that position in an extending direction relative to the first rail.

According to yet another aspect of the present invention, a bracket device includes a bracket and an engagement member. The bracket includes a longitudinal wall and an end wall. The end wall is substantially perpendicularly connected to the longitudinal wall and is connected with at least one mounting member. The engagement member is operatively arranged on the longitudinal wall of the bracket and, when operated, can be transversely moved relative to the longitudinal wall from a first position to a second position.

In some embodiments of any one of the foregoing aspects, the longitudinal wall of the bracket further includes a window, the bracket device further includes a base corresponding to the window, and an elastic member is arranged between the base and the engagement member to bias the engagement member elastically, allowing the engagement member to be at one of an engaged position and a disengaged position relative to the portion of the object. The engagement member further includes an operating portion which corresponds to the window and can be operated.

In some embodiments of any one of the foregoing aspects, the portion of the object includes a blocking feature, and the engagement member includes an engaging portion releasably engaged with the blocking feature of the object.

In some embodiments of any one of the foregoing aspects, the bracket device further includes a hook member movably connected to the bracket via a connecting element, e.g., pivotally connected to at least one ear of the longitudinal wall of the bracket. The hook member includes a body portion and a hook portion. The hook portion is substantially transversely connected to the body portion, corresponds to the post of the rack, and passes through a space of the engagement member. In addition, the bracket device includes another elastic member, which biases the hook member elastically.

One of the advantageous features of applying the present invention is that an object can be selectively retained in place by the bracket device.

DETAILED DESCRIPTION OF THE INVENTION

Figure 1:
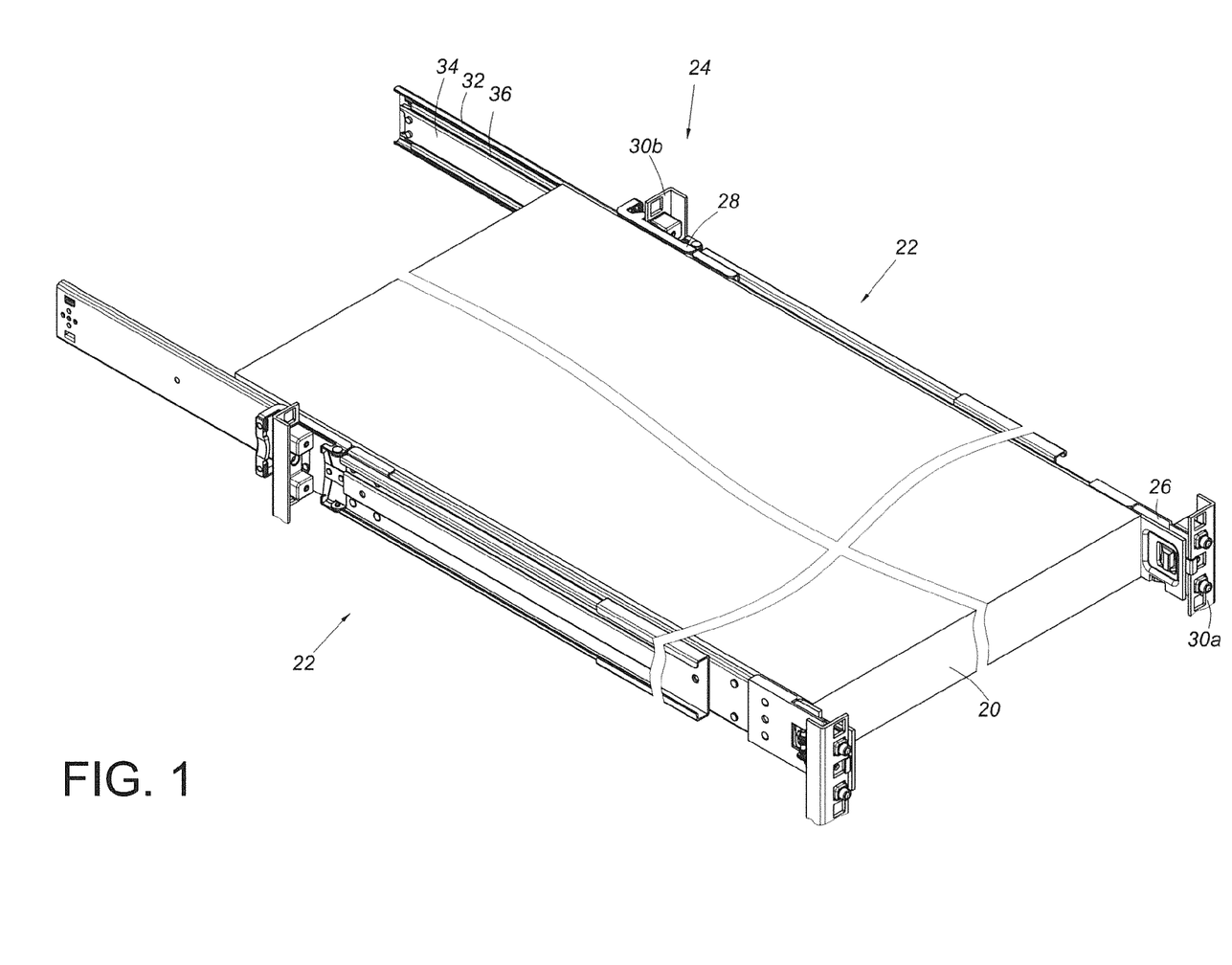
FIG. 1 is a perspective view of the bracket device in an embodiment of the present invention, wherein the bracket device is adapted to mount an object arranged on a slide rail assembly to a rack.

Referring to FIG. 1 for an embodiment of the present invention, an object 20 is mounted to the plural posts of a rack 24 via a pair of slide rail assemblies 22. More specifically, each slide rail assembly 22 has two portions respectively attached with a bracket device 26 and another bracket device 28, and is mounted to a pair of posts 30a and 30b of the rack 24 via the corresponding bracket devices 26 and 28.

Each slide rail assembly 22 includes a first rail 32 and a second rail 34 longitudinally displaceable relative to the first rail 32. Preferably, each slide rail assembly 22 further includes a third rail 36 longitudinally movably connected between the first rail 32 and the second rail 34 so as to extend the distance by which the second rail 34 can be displaced relative to the first rail 32. The object 20 is arranged on the second rails 34 of the slide rail assemblies 22 and can therefore be moved out of or retracted into the rack 24 by displacing the second rails 34 relative to the first rails 32.

Figure 2:
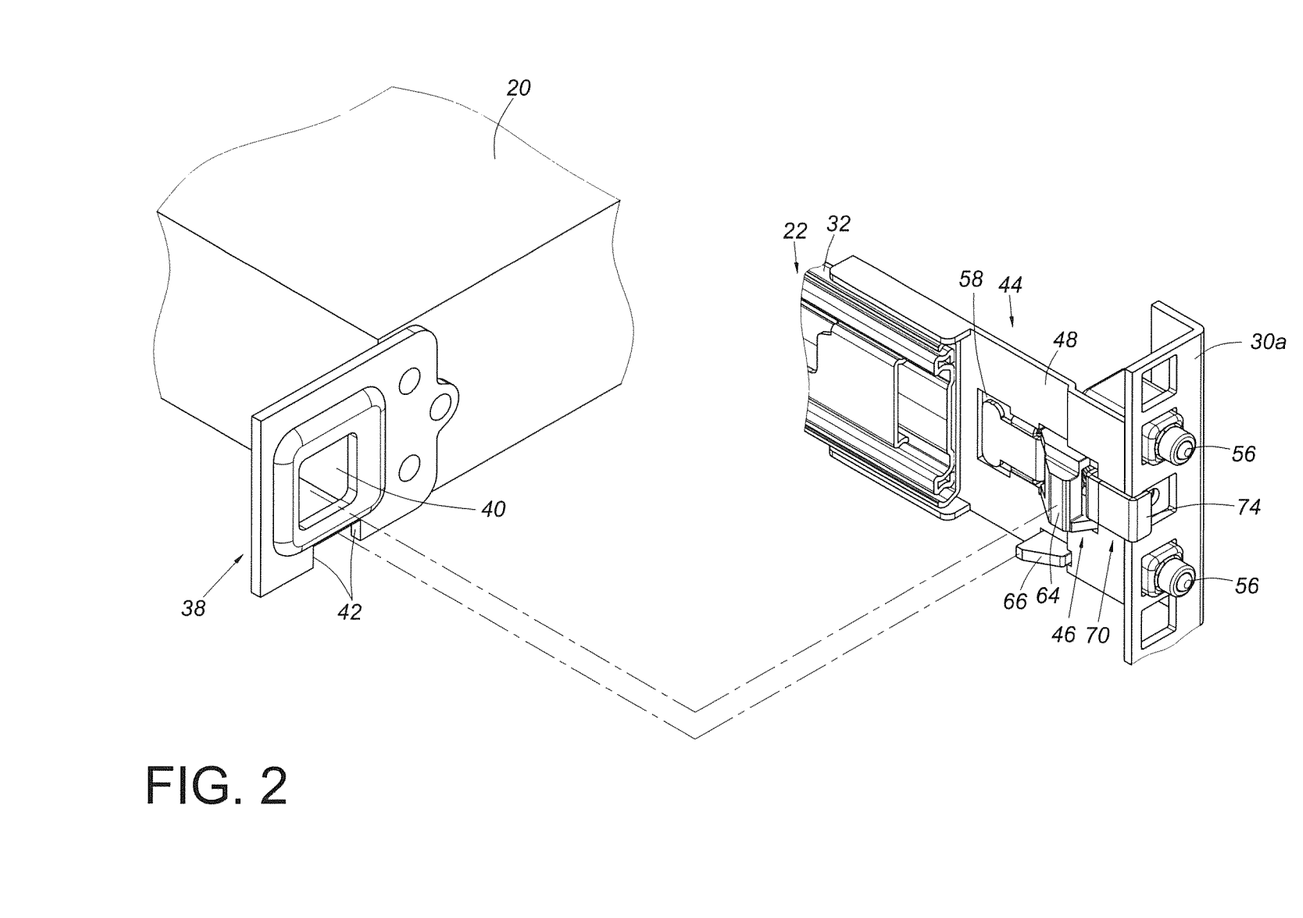
FIG. 2 shows how the bracket device in an embodiment of the present invention mounts a slide rail assembly to a post, and how the engagement member of the bracket device corresponds to a portion of an object.

As shown in FIG. 2, the object 20 includes a portion 38, which can be integrally formed with or indirectly attached to the object 20 without limitation. Preferably, the portion 38 includes an opening 40 and a blocking feature 42. Here, the blocking feature 42 is located adjacent to the opening 40 by way of example.

Figure 3:
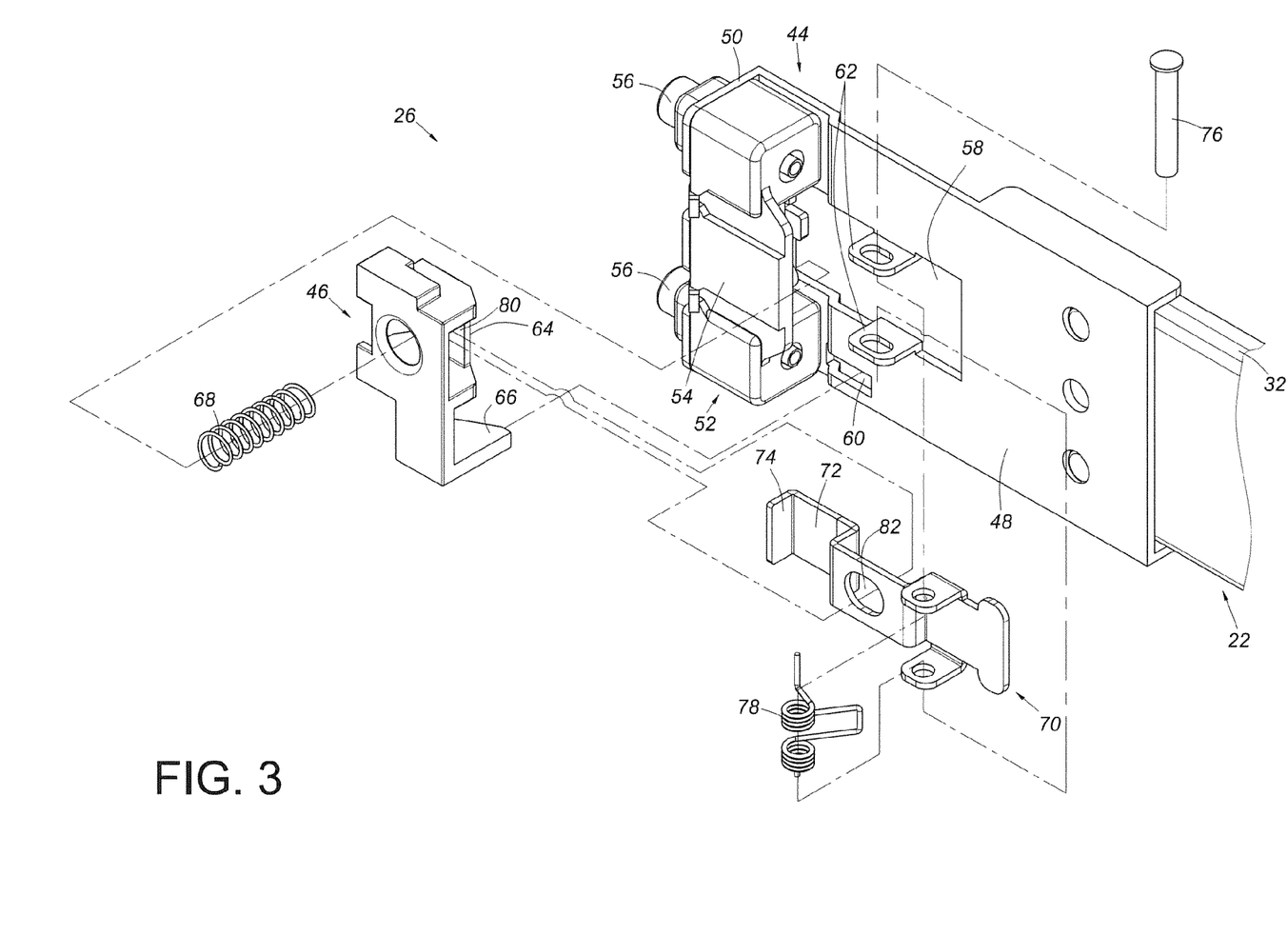
FIG. 3 is an exploded perspective view of the bracket device in an embodiment of the present invention, wherein the bracket device has a bracket for connecting with a slide rail assembly.

Referring also to FIG. 3, the bracket device 26 includes a bracket 44 and an engagement member 46.

The bracket 44 is connected to the first rail 32 of the slide rail assembly 22. More specifically, the bracket 44 includes a longitudinal wall 48, an end wall 50 substantially perpendicularly connected to the longitudinal wall 48, and a mounting assembly 52. The mounting assembly 52 includes a base 54 and at least one mounting member 56. The base 54 is fixedly mounted to the bracket 44 at a position adjacent to the end wall 50. The at least one mounting member 56 is mounted to the base 54 and has a portion extending beyond the end wall 50. By mounting the at least one mounting member 56 to the post 30a, the bracket 44 is attached to the post 30a. Preferably, the longitudinal wall 48 has a window 58, a through hole 60 arranged adjacent to the window 58, and at least one ear 62, and the base 54 has a portion corresponding to the window 58.

The engagement member 46 is operatively arranged on the longitudinal wall 48 of the bracket 44. Preferably, the engagement member 46 includes an operating portion 64 and an engaging portion 66. The operating portion 64 corresponds to the window 58 in order to be operated. The engaging portion 66 corresponds to the through hole 60 of the bracket 44. In this embodiment, the engagement member 46 is elastically biased by an elastic member 68.

Figure 5:
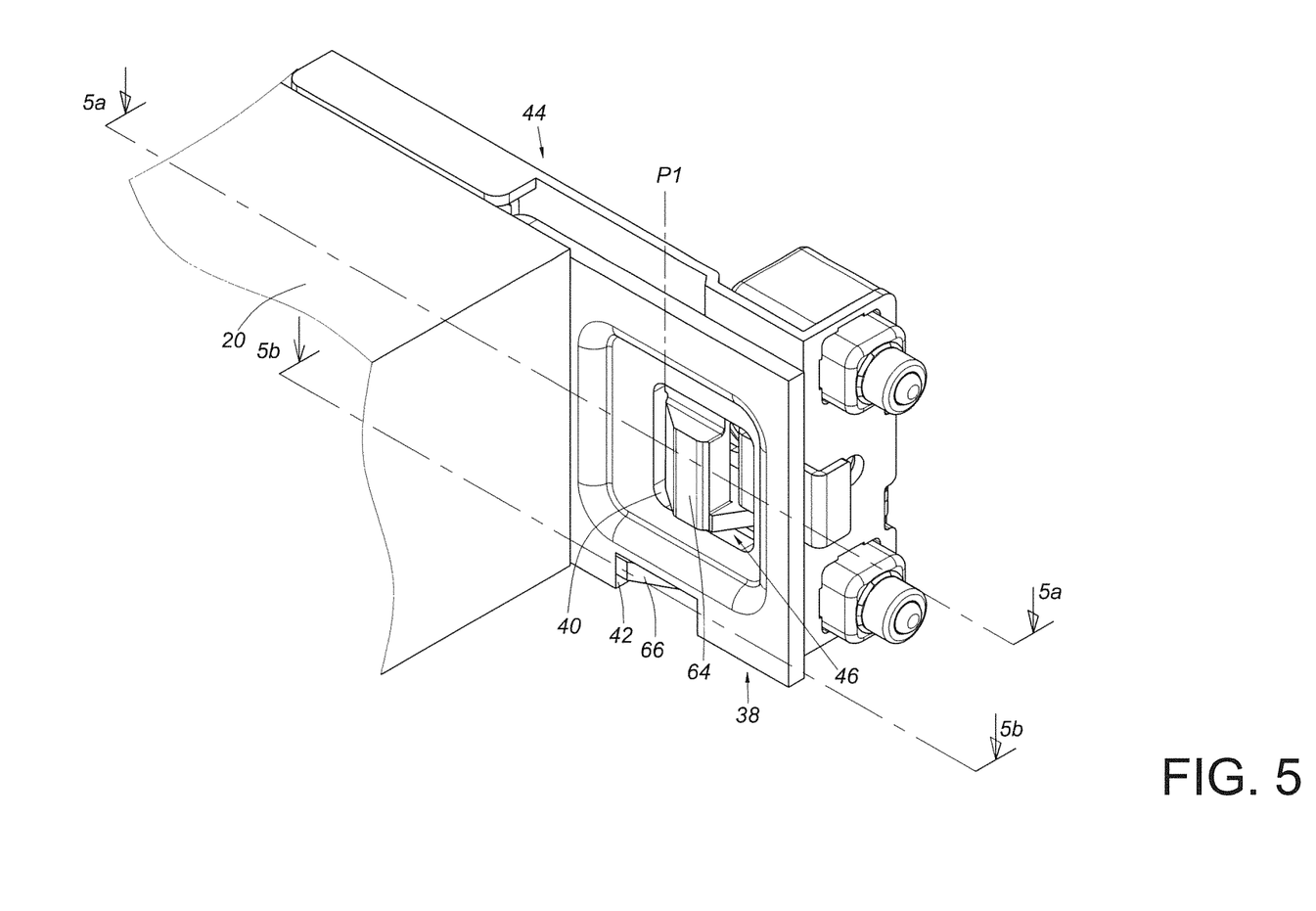
FIG. 5 is a perspective view in which the engagement member of the bracket device in an embodiment of the present invention corresponds to a portion of an object, showing in particular how the engagement member engages with that portion of the object.
Figure 5A:
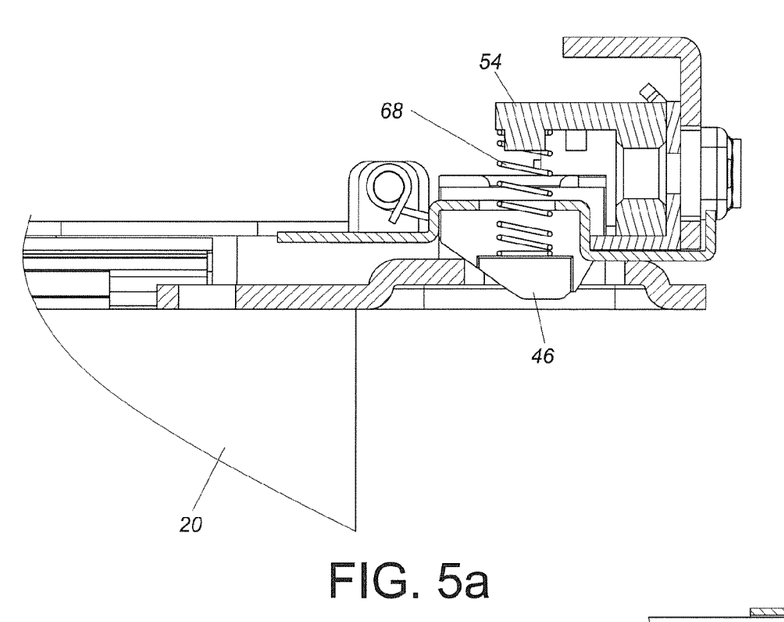
FIG. 5a is a sectional view taken along line 5a-5a in FIG. 5.
Figure 5B:
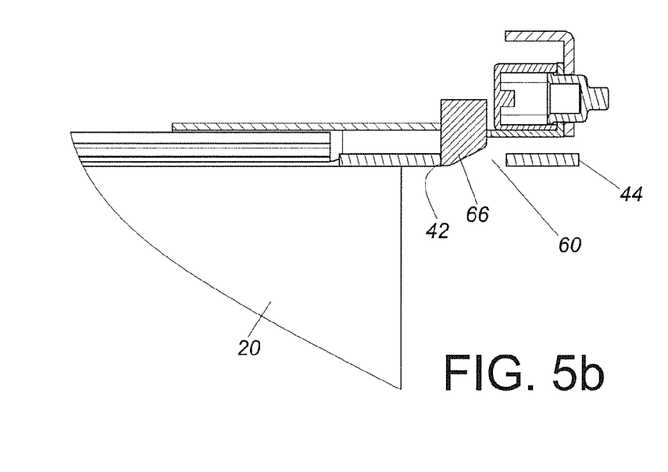
FIG. 5b is a sectional view taken along line 5b-5b in FIG. 5.

For example, as shown in FIG. 5, FIG. 5a, and FIG. 5b, the elastic member 68 is arranged between the engagement member 46 and the base 54 in order to apply an elastic force to the engagement member 46. The engagement member 46 responds to the elastic force by passing the engaging portion 66 through the through hole 60 of the bracket 44 and thus bringing the engaging portion 66 into engagement with the blocking feature 42 of the object 20.

Figure 6:
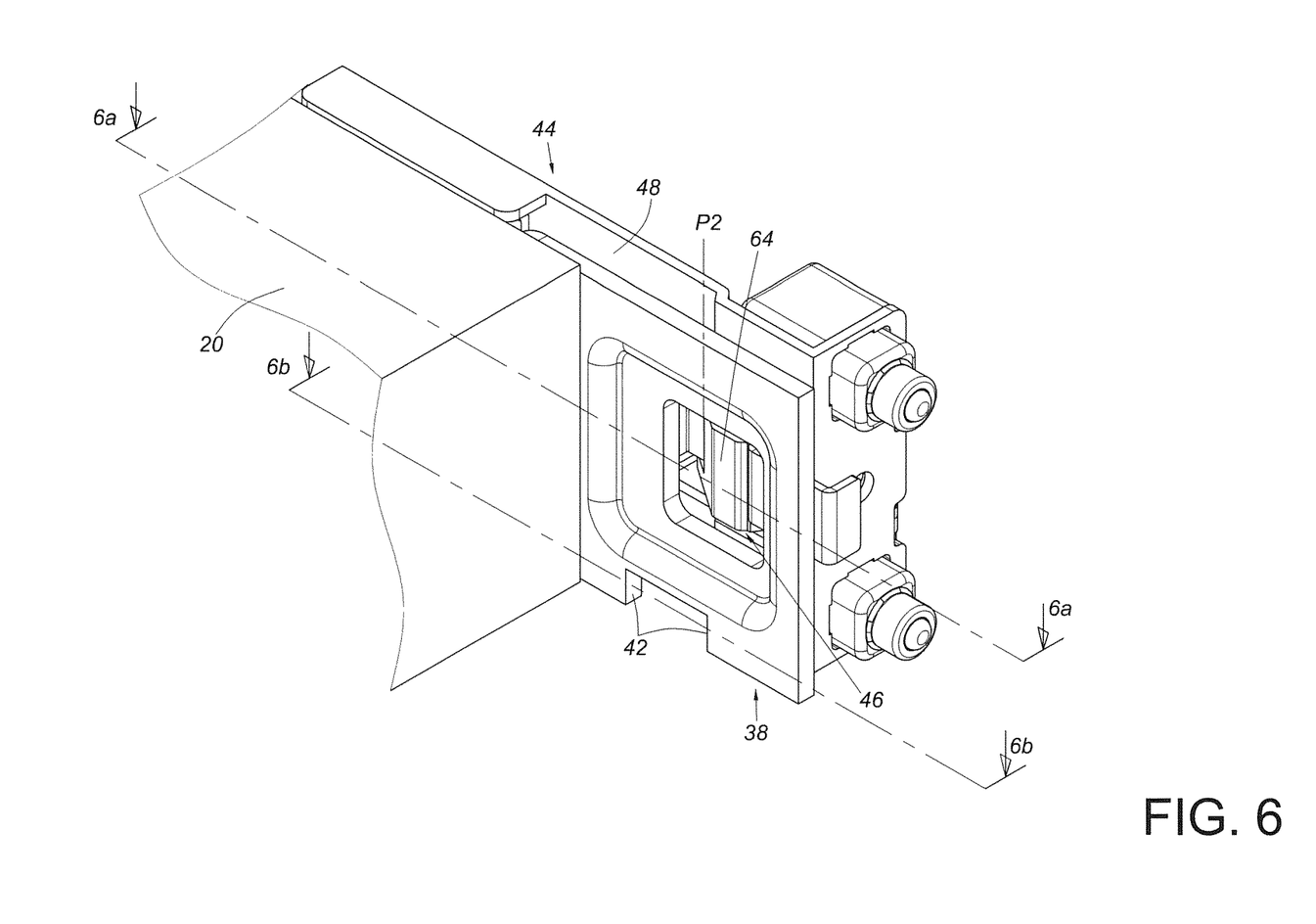
FIG. 6 is a perspective view in which the engagement member in FIG. 5 is operated and therefore has disengaged from the portion of the object.
Figures 6A, 6B:
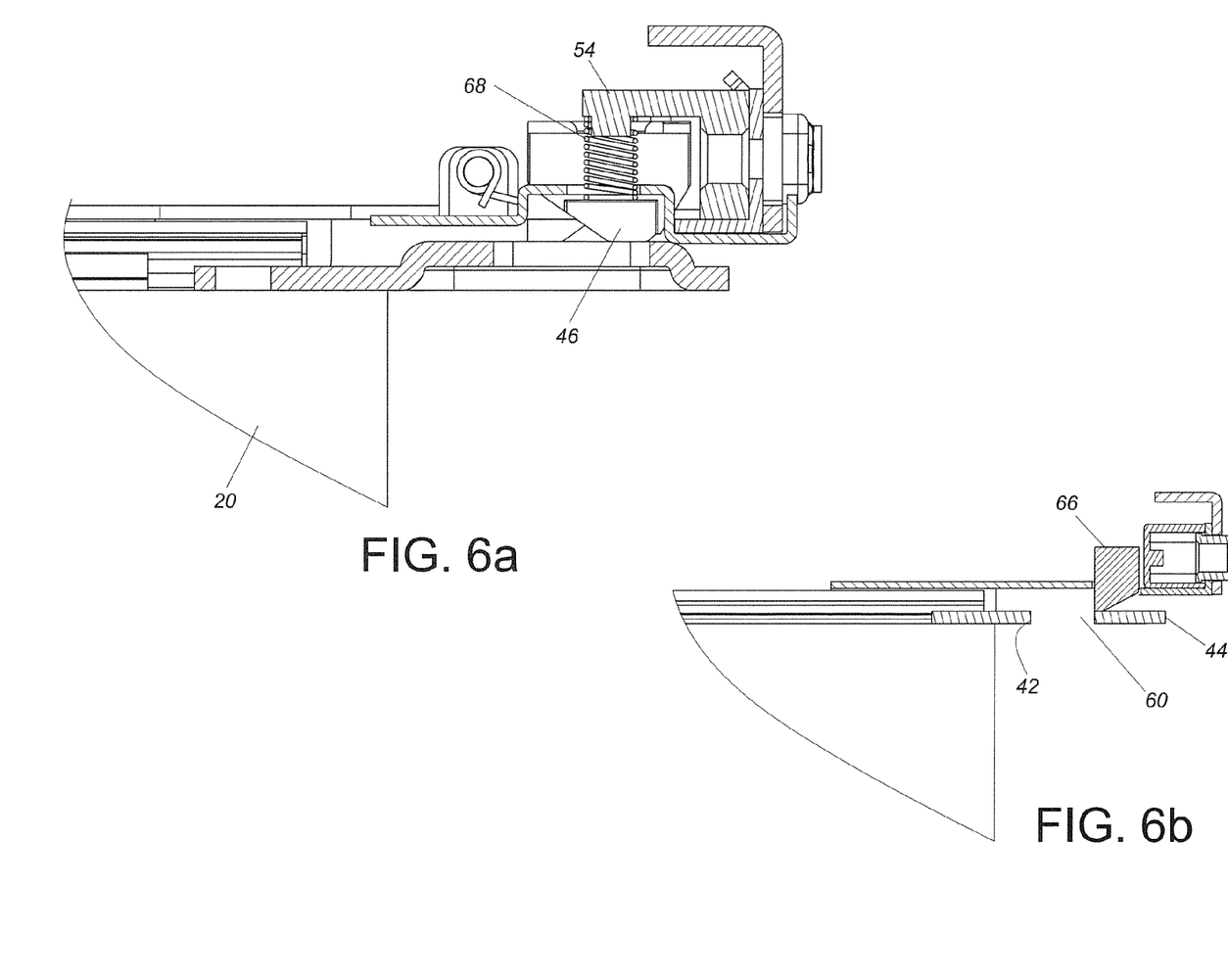
FIG. 6a is a sectional view taken along line 6a-6a in FIG. 6.
FIG. 6b is a sectional view taken along line 6b-6b in FIG. 6.

The engaging portion 66 of the engagement member 46 can be disengaged from the blocking feature 42 of the object 20 by operating the operating portion 64, as shown in FIG. 6, FIG. 6a, and FIG. 6b.

Figure 4:
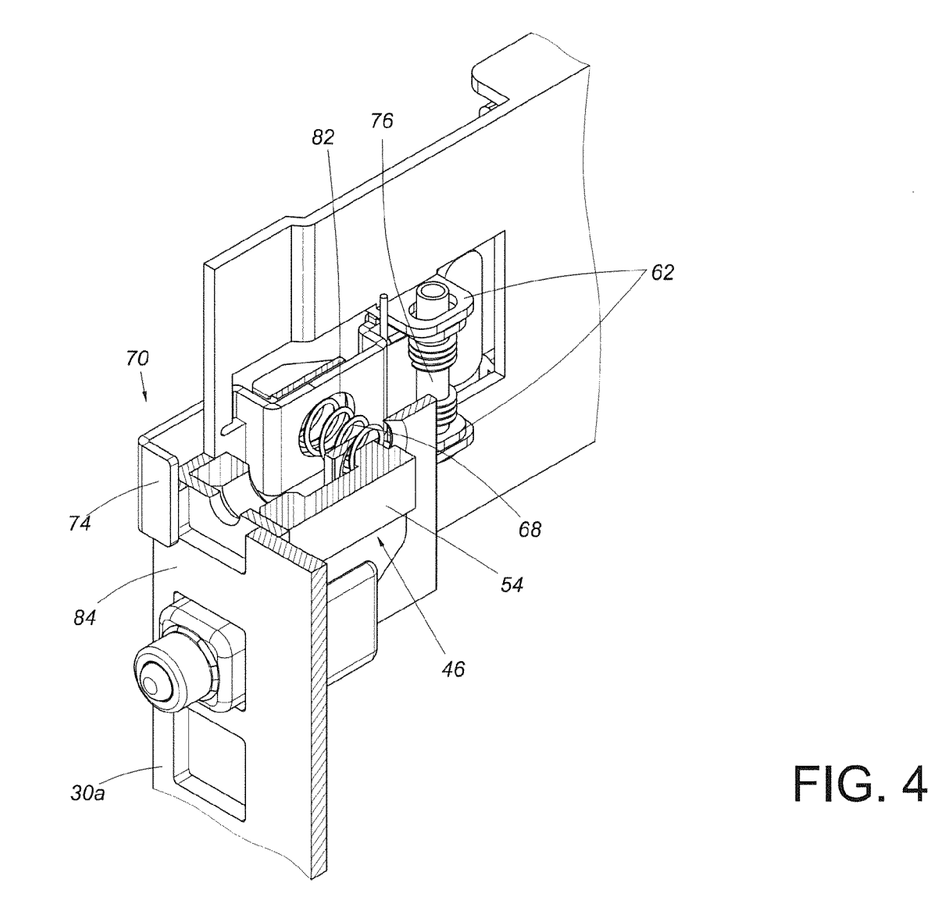
FIG. 4 is a perspective view in which the bracket device in an embodiment of the present invention is mounted to a post, showing in particular the elastic member which is arranged between the engagement member and the base and extends through the hook member.

Referring to FIG. 3 and FIG. 4, the bracket device 26 preferably further includes a hook member 70 movably connected to the longitudinal wall 48 of the bracket 44. The hook member 70 includes a body portion 72 and a hook portion 74 substantially transversely connected to the body portion 72. Moreover, the hook member 70 is pivotally connected to the at least one ear 62 via a connecting element 76 and is elastically biased by another elastic member 78 such that the hook member 70 has a retaining force resulting from the elastic force generated by the elastic member 78. Preferably, the engagement member 46 includes a space 80, and the hook portion 74 of the hook member 70 passes through the space 80 and extends beyond the end wall 50 of the bracket 44. Thus, with the at least one mounting member 56 mounted to the post 30a and the hook portion 74 hooked to the backside of the post 30a, the bracket 44 is securely attached to the post 30a at a predetermined position. The hook member 70 also has a mounting hole 82 through which the elastic member 68 can pass. Besides, once the hook member 70 is pivotally connected to the at least one ear 62 via the connecting element 76, the hook portion 74 of the hook member 70 corresponds to a surface 84 of the post 30a. For example, the hook portion 74 can be blocked by or in contact with the surface 84 of the post 30a to ensure that the bracket device is reliably mounted to the post 30a.

Referring to FIG. 5, FIG. 5a, and FIG. 5b in conjunction with FIG. 1, when the second rail 34 is at a certain position, e.g., the retracted position, relative to the first rail 32, the opening 40 of the portion 38 of the object 20 corresponds to the operating portion 64 of the engagement member 46. On the other hand, the engaging portion 66 of the engagement member 46 is engaged with the blocking feature 42 of the portion 38 of the object 20. That is to say, by virtue of the elastic member 68, the engagement member 46 can be retained at a first position P1, or engaged position, relative to the portion 38 of the object 20.

When the operating portion 64 of the engagement member 46 is subsequently operated (e.g., pressed), as shown in FIG. 6, FIG. 6a, and FIG. 6b, the engaging portion 66 of the engagement member 46 is disengaged from the blocking feature 42 of the portion 38 of the object 20 in response to the operation. In other words, the engagement member 46 can be transversely moved relative to the longitudinal wall 48 of the bracket 44 from the first position P1, or engaged position, relative to the portion 38 of the object 20 to a second position P2, or disengaged position.

Figure 7:
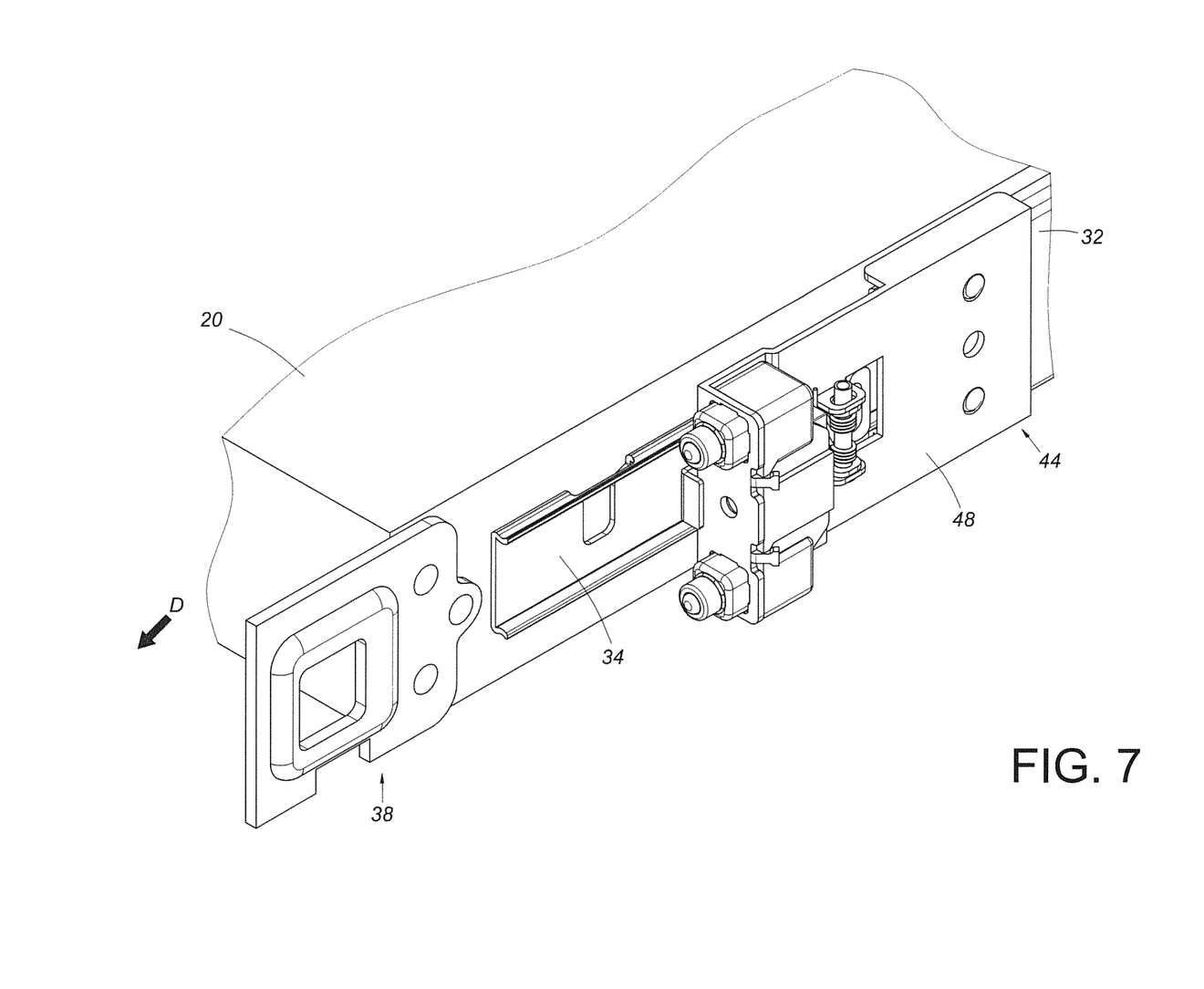
FIG. 7 is a perspective view showing how the object in FIG. 6 is pulled out as the second rail is displaced in an extending direction relative to the first rail.

Referring to FIG. 7, once the engagement member 46 is moved to the second position P2 relative to the portion 38 of the object 20, the second rail 34 can be moved in an extending direction D relative to the first rail 32, allowing the object 20 to be pulled out relative to the first rail 32 via the second rail 34.

While the present invention has been disclosed through the foregoing embodiments, the embodiments are not intended to be restrictive of the invention. The scope of patent protection sought by the applicant is defined by the appended claims.

What is claimed is:

1. A bracket device adapted to mount an object arranged on a slide rail assembly to a post of a rack, the bracket device comprising:
   a bracket connected to the slide rail assembly, the bracket having a longitudinal wall and an end wall substantially perpendicularly connected to the longitudinal wall, the end wall being mounted to the post of the rack via at least one mounting member;

an engagement member arranged on the bracket and releasably engaged with a portion of the object; and an elastic member biasing the engagement member resiliently to thereby dispose the engagement member at either one of an engaged position or a disengaged position relative to the portion of the object.

2. The bracket device of claim 1, wherein the longitudinal wall of the bracket has a window, the bracket device includes a base corresponding to the window, and the elastic member is arranged between the base and the engagement member.

3. The bracket device of claim 2, wherein the engagement member has an operating portion corresponding to the window.

4. The bracket device of claim 1, wherein the portion of the object has a blocking feature, and the engagement member has an engaging portion releasably engaged with the blocking feature of the object.

5. A bracket device adapted to mount an object arranged on a slide rail assembly to a post of a rack, the bracket device comprising:

a bracket connected to the slide rail assembly, the bracket having a longitudinal wall and an end wall substantially perpendicularly connected to the longitudinal wall, the end wall being mounted to the post of the rack via at least one mounting member;

an engagement member arranged on the bracket and releasably engaged with a portion of the object; and a hook member movably connected to the longitudinal wall of the bracket, the hook member including a body portion and a hook portion substantially transversely connected to the body portion, the hook portion corresponding to the post of the rack.

6. The bracket device of claim 5, wherein the longitudinal wall of the bracket includes at least one ear, the hook member is pivotally connected to the at least one ear via a connecting element, and the bracket device includes another elastic member biasing the hook member elastically.

7. The bracket device of claim 5, wherein the engagement member includes a space, and the hook portion of the hook member passes through the space of the engagement member.

8. A bracket device adapted to mount a slide rail assembly to a post of a rack, the slide rail assembly including a first rail and a second rail longitudinally displaceable relative to the first rail, an object being arranged on the second rail, the bracket device comprising:

a bracket connected to the first rail of the slide rail assembly, the bracket having a longitudinal wall and an end wall substantially perpendicularly connected to the longitudinal wall, the end wall being mounted to the post of the rack via at least one mounting member;

an engagement member operatively arranged on the bracket to releasably engage a portion of the object; and an elastic member biasing the engagement member resiliently to thereby dispose the engagement member at either one of an engaged position or a disengaged position relative to the portion of the object;

wherein the engagement member is in the engaged position when the second rail is at a position relative to the first rail; and wherein the second rail is movable from the position in an extending direction relative to the first rail when the engagement member is disengaged from the portion of the object by being operated.

9. A bracket device, comprising:

a bracket having a longitudinal wall and an end wall substantially perpendicularly connected to the longitudinal wall, the end wall being connected with at least one mounting member;

an engagement member operatively arranged on the longitudinal wall of the bracket; and an elastic member biasing the engagement member resiliently to thereby dispose the engagement member at either one of a first position or a second position relative to the longitudinal wall of the bracket;

wherein when operated, the engagement member is transversely movable relative to the longitudinal wall from the first position to the second position.

* * * * *